(12) United States Patent
Senbokuya et al.

(10) Patent No.: US 10,569,339 B2
(45) Date of Patent: Feb. 25, 2020

(54) SURFACE-COATED CUTTING TOOL

(71) Applicant: MITSUBISHI MATERIALS CORPORATION, Tokyo (JP)

(72) Inventors: Kazuaki Senbokuya, Naka (JP); Masakuni Takahashi, Ogaki (JP); Tsuyoshi Ogami, Naka (JP); Tatsuo Hashimoto, Akashi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 223 days.

(21) Appl. No.: 15/545,182

(22) PCT Filed: Jan. 22, 2016

(86) PCT No.: PCT/JP2016/051843
§ 371 (c)(1),
(2) Date: Jul. 20, 2017

(87) PCT Pub. No.: WO2016/117681
PCT Pub. Date: Jul. 28, 2016

(65) Prior Publication Data
US 2018/0021858 A1 Jan. 25, 2018

(30) Foreign Application Priority Data

Jan. 22, 2015 (JP) .................................. 2015-010351
Jan. 20, 2016 (JP) .................................. 2016-008494

(51) Int. Cl.
*B23B 7/14* (2006.01)
*B23B 27/14* (2006.01)
(Continued)

(52) U.S. Cl.
CPC ............ *B23B 27/148* (2013.01); *B23C 5/207* (2013.01); *B26D 1/0006* (2013.01);
(Continued)

(58) Field of Classification Search
USPC .......... 51/307, 309; 428/325, 336, 697, 698, 428/699
See application file for complete search history.

(56) References Cited

U.S. PATENT DOCUMENTS

| | | | |
|---|---|---|---|
| 7,763,366 B2* | 7/2010 | Yamamoto | C23C 14/06 428/698 |
| 2008/0003418 A1* | 1/2008 | Yamamoto | C23C 14/0021 428/213 |
| 2011/0183131 A1* | 7/2011 | Maeda | B23F 21/00 428/216 |

FOREIGN PATENT DOCUMENTS

| | | |
|---|---|---|
| CN | 1638900 A | 7/2005 |
| CN | 1675015 A | 9/2005 |

(Continued)

OTHER PUBLICATIONS

Endrino et al "Determination of the local environment of silicon and the microstucture of quaternary CrAl(Si)N films" Acta Material 55 p. 2129-2135. (Year: 2007).*

(Continued)

*Primary Examiner* — Archene A Turner
(74) *Attorney, Agent, or Firm* — Leason Ellis LLP

(57) ABSTRACT

In a surface-coated cutting tool, a hard coating includes one or more layers. At least one layer thereof is a hard coating layer composed of a complex nitride or carbonitride layer of Al, Cr, and Si and satisfying $(Al_{1-x-y}Cr_xSi_y)(C_zN_{1-z})$ where x, y and z are atomic ratios and satisfy $0.1 \leq x \leq 0.4$, $0.01 \leq y \leq 0.2$, and $0 \leq z \leq 0.3$, respectively. The hard coating layer contains particles including: less than 10 atomic % of non-metal components selected from C and N; and metal components selected from Cr, Al and Si. In the cross-section perpendicular to the tool body surface, the number ratio of oblate particles with an Al content of 50 atomic % or less, a long diameter of less than 0.5 μm, and an aspect ratio of 2.0 or (Continued)

TEM IMAGE more is 90% or more with respect to the total number of the particles.

11 Claims, 4 Drawing Sheets

(51) Int. Cl.
    *C23C 14/54*      (2006.01)
    *C23C 14/32*      (2006.01)
    *C23C 14/00*      (2006.01)
    *C23C 14/06*      (2006.01)
    *B23C 5/20*      (2006.01)
    *B26D 1/00*      (2006.01)
    *C23C 14/26*      (2006.01)
    *C23C 28/04*      (2006.01)
    *C23C 30/00*      (2006.01)

(52) U.S. Cl.
    CPC ...... *C23C 14/0021* (2013.01); *C23C 14/0641* (2013.01); *C23C 14/0652* (2013.01); *C23C 14/0664* (2013.01); *C23C 14/26* (2013.01); *C23C 14/325* (2013.01); *C23C 14/541* (2013.01); *B23B 2222/92* (2013.01); *B23B 2228/105* (2013.01); *C23C 28/044* (2013.01); *C23C 30/005* (2013.01)

(56) References Cited

FOREIGN PATENT DOCUMENTS

| | | | |
|---|---|---|---|
| CN | 102371378 A | | 3/2012 |
| JP | 2002-337007 | * | 11/2002 |
| JP | 2006-239792 | * | 9/2006 |
| JP | 2008-238336 A | | 10/2008 |
| JP | 2012-166333 A | | 9/2012 |
| JP | 2013-046954 A | | 3/2013 |
| JP | 2013-046955 A | | 3/2013 |
| JP | 2014-087861 A | | 5/2014 |

OTHER PUBLICATIONS

International Search Report dated Mar. 8, 2016 for the corresponding PCT Application No. PCT/JP2016/051843.
Office Action dated Jun. 19, 2018 for the corresponding Chinese Patent Application No. 201680005874.3.
European Search Report dated May 15, 2018 for the corresponding European Patent Application No. 16740288.2.

* cited by examiner

TEM IMAGE

| RESULT OF EDS COMPOSITION ANALYSIS [at.%] |||| 
|---|---|---|---|
| Al | Cr | Si | N |
| 1.8 | 44.1 | 45.6 | 8.5 |

SURFACE-COATED CUTTING TOOL

CROSS-REFERENCE TO RELATED PATENT APPLICATIONS

This application is a U.S. National Phase Application under 35 U.S.C. § 371 of International Patent Application No. PCT/JP2016/051843 filed on Jan. 22, 2016 and claims the benefit of Japanese Patent Applications No. 2015-010351 filed on Jan. 22, 2015 and No. 2016-008494 filed on Jan. 20, 2016, all of which are incorporated herein by reference in their entirety. The International Application was published in Japanese on Jul. 28, 2016 as International Publication No. WO/2016/117681 under PCT Article 21(2).

FIELD OF THE INVENTION

The present invention relates to a surface-coated cutting tool (hereafter, referred to as coated tool) that exhibits excellent cutting performance in long-term usage by improving a chipping resistance and an adhesion resistance of a hard coating layer thereof, for example, in milling of work material such as an alloy tool steel.

BACKGROUND OF THE INVENTION

In the related art, for example, as disclosed in Japanese Unexamined Patent Application, First Publication No. 2013-46954 (A), a surface-coated cutting tool is known, in which a hard coating layer made of a complex carbonitride layer or a complex nitride layer that has an average thickness of 0.5 to 8.0 μm and satisfies a composition formula: $(Al_{1-x-y}Cr_xSi_y)(N_{1-z}C_z)$ (where x, y and z satisfy $0.3 \leq x \leq 0.7$, $0 \leq y \leq 0.1$, and $0 \leq z \leq 0.3$, respectively) is formed on the surface of a tool body; the hard coating layer includes particles containing 90 atomic % or more of metallic element with respect to constituent elements thereof; the particles have a cross-sectional long diameter of 0.05 to 1.0 μm and are dispersed at a longitudinal cross-sectional area ratio of 3 to 20% of the hard coating layer; $0.3 \leq A/(A+B)$ is satisfied where among the particles, A % is a longitudinal cross-section area ratio of particles of which the constituent elements contain 50 atomic % or more of Al and which has an aspect ratio of 2.0 or more in the longitudinal cross-section and the cross-sectional long diameter forming an acute angle of 45° or less with respect to the surface of the tool body and B % is a longitudinal cross-section area ratio of the other particles; and excellent fracturing resistance and wear resistance are exhibited in a face milling of a carbon steel, an alloy tool steel or the like.

As disclosed in Japanese Unexamined Patent Application, First Publication No. 2012-166333 (A), a surface-coated cutting tool is known, in which at least hard coating layer with a thickness of 0.5 to 10 μm and made of a complex nitride layer of Al and Cr is formed on the surface of a tool body; pores and droplets are dispersed in the complex nitride layer of Al and Cr; an area ratio occupied by the pores is 0.5 to 1 area % and an area ratio occupied by the droplets is 2 to 4 area % in an arbitrary cross-section of the complex nitride layer of Al and Cr; among the droplets, Al-rich droplets with Al content higher than the average Al content in the complex nitride layer of Al and Cr occupies an area of 20% or more with respect to the total area of the droplets in the arbitrary cross-section of the complex nitride layer of Al and Cr; and excellent fracturing resistance and wear resistance are exhibited in high-speed cutting of a carbon steel, an alloy tool steel or the like.

As disclosed in Japanese Unexamined Patent Application, First Publication No. 2008-238336 (A), a surface-coated cutting tool such as an end mill is known, in which a plurality of macro-particles protrude from the surface of a hard coating layer made of $Ti_{1-a-b}Al_aM_b(C_xN_{1-x})$ (where M is one or more selected from group 4, 5, and 6 elements of Periodic table excluding Ti, rare earth elements, and Si, and a, b and x satisfy $0.40 \leq a \leq 0.65$, $0 \leq b \leq 0.5$, and $0 \leq x \leq 1$, respectively); the macro-particles protrude from a rake face continuous with cutting edges of an end cutting edge and a peripheral cutting edge toward a direction away from the cutting edges at an average angle of 5 to 20° with respect to a normal direction to interface between a tool body and the coating layer; and the macro-particles incline and protrude thereby dispersing impact from chips, preventing the macro-particles from falling off, and improving chipping resistance.

Technical Problem

There has been a strong demand for power saving and energy saving during cutting work in recent years. In accordance with this, the coated tools become used under further severe conditions. In order to improve fracturing resistance, wear resistance and the like, the performances of the coated tools have been improved as the means disclosed in Japanese Unexamined Patent Application, First Publication No. 2013-46954 (A), Japanese Unexamined Patent Application, First Publication No. 2012-166333 (A) and Japanese Unexamined Patent Application, First Publication No. 2008-238336 (A). However, the fracturing resistance has not been improved sufficiently, yet.

That is, in the surface-coated cutting tool disclosed in Japanese Unexamined Patent Application, First Publication No. 2013-46954 (A), the particles included in the hard coating layer contains 90 atomic % or more of metallic element with respect to constituent elements thereof, and the constituent elements contain 50 atomic % or more of Al. Thus, there is a problem in which the composition of the particles is Al-rich, the melting point thereof is low, high-temperature strength cannot be ensured and therefore adhesion resistance is deteriorated.

In the surface-coated cutting tool disclosed in Japanese Unexamined Patent Application, First Publication No. 2012-166333 (A), voids are formed below the droplets present in the hard coating layer. There is a problem in which due to the presence of the voids, strength of the hard coating layer is low when an external force is applied, for example, the voids serve as a start point of cracks during cutting, and chipping easily occurs.

In the surface-coated cutting tool disclosed in Japanese Unexamined Patent Application, First Publication No. 2008-238336 (A), there is a problem in which, under conditions where high load is applied, a plurality of the macro-particles protruding from the surface of the hard coating layer fall off, which serves as a start point of generation of cracks, and thus sufficient chipping resistance cannot be exhibited.

Accordingly, the objective of the present invention is to provide a surface-coated cutting tool exhibiting excellent chipping resistance and adhesion resistance even when being used in milling of alloy tool steel or the like.

SUMMARY OF THE INVENTION

Solution to Problem

From the above-described views, the inventors intensively studied on a coated tool exhibiting excellent cutting performance in long-term usage even when being used in machining such as milling simultaneously requiring chipping resistance and adhesion resistance in addition to wear resistance. As a result, the following knowledge was obtained.

That is, the inventors found that a surface-coated cutting tool in which a hard coating including a hard coating layer with the following configuration is formed on a surface of a tool body, exhibits excellent cutting performance in long-term usage.

This hard coating layer is a layer included in the hard coating, includes a complex carbonitride layer of Al, Cr, and Si (hereafter, "(Al, Cr, Si)(C, N) layer") or a complex nitride layer of Al, Cr, and Si (hereafter, "(Al, Cr, Si)N layer"), and has an average thickness of 0.5 to 8.0 µm. This hard coating layer includes a plurality of particles. A plurality of these particles include a particle (hereafter, "oblate particle") which includes 90 atomic % or more of one or more selected from Cr, Al and Si (less than 10 atomic % of one or more non-metal components selected from C and N) with respect to the total amount of constituent elements, in which the constituent elements includes 50 atomic % or less of Al, and which has a long diameter of less than 0.5 µm and an aspect ratio of 2.0 or more in a longitudinal cross-section of the hard coating layer perpendicular to the surface of the tool body. The number ratio of the oblate particles is 90% or more with respect to the total number of the particles.

The (Al, Cr, Si)(C, N) layer or the (Al, Cr, Si)N layer including such particles (the oblate particles) exhibits excellent chipping resistance and adhesion resistance. As a result, the surface-coated cutting tool on which the hard coating including this hard coating layer is formed exhibits excellent cutting performance in long-term usage.

Additionally, it is more preferable that, when an inclination angle between a straight line forming a cross-sectional long diameter of the respective oblate particles and the surface of the tool body is measured, the number ratio of the oblate particles each of which has the inclination angle of 45° or less and satisfies A>B where A is an area of a region surrounded by the straight line forming the long diameter and outer circumference of the particle at a surface side of the hard coating and B is an area of region surrounded by the straight line and the outer circumference of the particle at a tool body side, is 80% or more with respect to the total number of the particles. The (Al, Cr, Si)(C, N) layer or the (Al, Cr, Si)N layer including such particles exhibits more excellent chipping resistance and adhesion resistance, and exhibits more excellent cutting performance in long-term usage.

The hard coating layer can be formed using a PVD method on the surface of the tool body made of tungsten carbide-based cemented carbide.

For example, in the present invention, film formation can be performed using an arc ion plating furnace 1 shown schematically in FIG. 1A and FIG. 1B. In this case, in addition to a heater 6 for controlling atmosphere temperature in an entire furnace, preferably, cylindrical heaters 7 are provided in front of targets 4A, 4B to heat the space in front of the targets to high temperature. Thereby, it is possible to prevent particles generated from the targets 4A, 4B from solidifying in the atmosphere, and by attaching particles to the tool body 9 in high temperature, the particles deform along the shape of the surface of the tool body due to impact of the attachment. Therefore, the particles deform along the shape of the smooth surface of the tool body. As seeing the longitudinal cross-section (the cross-section perpendicular to the surface of the tool body) of the film, the particles become an oblate shape along the surface of the tool body, and an angle between the straight line forming a cross-sectional long diameter of each particle and the surface of the tool body is controlled to be 45° or less. The particles with an Al content of 50 atomic % or less are dispersed in the hard coating layer and are formed in oblate shape with a large aspect ratio and along the surface of the tool body. Thereby, resistance during cutting becomes smaller, the particles are difficult to fall off, and even when the particle falls off, damage in the layer thickness direction is small. As a result, it is possible to provide the hard coating layer with excellent chipping resistance and adhesion resistance.

The cylindrical heaters 7 are disposed so that the thickness directions thereof are perpendicular to the used surfaces of the corresponding targets 4A, 4B. Further, the cylindrical heaters 7 are disposed in front of the targets 4A, 4B such that the centers of the used surfaces of the targets 4A, 4B are located on the center axes of the cylindrical heaters 7.

The distance between the posterior end of the cylindrical heaters 7 (the end faces to the corresponding target and is closer to the corresponding target) and the used surface of the corresponding target is set to, for example, 50 mm or less. The distance between the front end of the cylindrical heaters 7 (the end faces to the same direction as the direction to which the corresponding target faces, and is far from the corresponding target) and the used surface of the corresponding target is set to, for example, ⅔ of the distance to the tool body (the distance to the tool body which is the closest to the target among a plurality of tool body arranged on the rotation table) from the target.

In addition, by providing a cooling mechanism on the tool body jigs 8, it is possible to prevent damage to the film due to radiation heat from the cylindrical heater 7. By performing the film formation using the film formation furnace having such mechanism, the characteristic hard coating in the surface-coated cutting tool according to an aspect of the present invention is formed.

Additionally, it was found that by adjusting the temperature inside of the PVD furnace, arc current of the targets, total pressure of nitrogen and methane, or the like, it is possible to control: for each particle in the (Al, Cr, Si)(C, N) layer or the (Al, Cr, Si)N layer, the composition; the cross-sectional long diameter; the aspect ratio in the longitudinal cross-section thereof; and magnitude relationship between the area A of a region surrounded by a straight line forming the cross-sectional long diameter and the outer circumference of the particle at the surface side of the hard coating and area B of a region surrounded by the straight line and the outer circumference of the particle at a tool body side in each particle with an angle 45° or less between the straight line forming the cross-sectional long diameter and the surface of the tool body.

Based on the above-described knowledge, the present invention has been accomplished. The present invention is not limited to the above-described production method.

The present invention was made based on the above-described knowledge, and is provided with the following aspect.

(1) A surface-coated cutting tool including:
a tool body made of tungsten carbide-based cemented carbide; and
a hard coating coated on a surface of the tool body, in which
(a) the hard coating includes one or more layers, and at least one layer thereof is a hard coating layer composed of a complex nitride layer or a complex carbonitride layer of Al, Cr, and Si, having an average thickness of 0.5 to 8.0 µm, and satisfying an average composition formula: $(Al_{1-x-y}Cr_xSi_y)(C_zN_{1-z})$ in which x, y and z are atomic ratios and satisfy $0.1 \leq x \leq 0.4$, $0.01 \leq y \leq 0.2$, and $0 \leq z \leq 0.3$, respectively;

(b) the hard coating layer includes a plurality of particles containing: less than 10 atomic % of non-metal component which is one or more selected from the group consisting of C and N, and metal component which is one or more elements selected from the group consisting of Cr, Al and Si; and (c) in a cross-section of the hard coating perpendicular to the surface of the tool body, a number ratio of oblate particles having an Al content of 50 atomic % or less, a long diameter of less than 0.5 µm in the cross-section, and an aspect ratio of 2.0 or more is 90% or more with respect to a total number of a plurality of the particles.

(2) The surface-coated cutting tool according to (1), in which in the cross-section of the hard coating perpendicular to the surface of the tool body, a number ratio of oblate particles in each of which an angle between a straight line forming the long diameter and the surface of the tool body is 45° or less and each of which satisfies A>B where A is an area of a region surrounded by the straight line and outer circumference of the oblate particle at a surface side of the hard coating and B is an area of region surrounded by the straight line and the outer circumference of the oblate particle at a tool body side, is 80% or more with respect to a total number of the oblate particles in the hard coating layer.

(3) The surface-coated cutting tool according to (1) or (2), in which the average thickness of the hard coating layer is 0.7 to 7.5 µm.

(4) The surface-coated cutting tool according to any one of (1) to (3), in which the hard coating layer is the outermost layer of the hard coating.

(5) The surface-coated cutting tool according to (1), in which the amount of the non-metal component is 0.5 atomic % or more and less than 10 atomic %.

(6) The surface-coated cutting tool according to (1), in which Al content of the metal component is 0.5 atomic % to 20 atomic %.

(7) The surface-coated cutting tool according to (1), in which the number of a plurality of the particles per unit area is $1/µm^2$ to $5/µm^2$ in the cross-section.

Advantageous Effects of Invention

The coated tool of an aspect of the present invention (hereafter, referred as "the coated tool of the present invention") is a surface-coated cutting tool including: a tool body made of tungsten carbide-based cemented carbide; and a hard coating coated on a surface of the tool body by a physical vapor deposition method, in which (a) the hard coating includes one or more layers, and at least one layer thereof is a hard coating layer composed of a complex nitride layer or a complex carbonitride layer of Al, Cr, and Si, having an average thickness of 0.5 to 8.0 µm, and satisfying an average composition formula: $(Al_{1-x-y}Cr_xSi_y)(C_zN_{1-z})$ in which x, y and z are atomic ratios and satisfy $0.1 \leq x \leq 0.4$, $0.01 \leq y \leq 0.2$, and $0 \leq z \leq 0.3$, respectively; (b) the hard coating layer includes a plurality of particles containing: less than 10 atomic % of non-metal component which is one or more selected from the group consisting of C and N; and metal component which is one or more elements selected from the group consisting of Cr, Al and Si; and (c) in a cross-section of the hard coating perpendicular to the surface of the tool body, a number ratio of oblate particles having an Al content of 50 atomic % or less, a cross-sectional long diameter of less than 0.5 µm in the cross-section, and an aspect ratio of 2.0 or more is 90% or more with respect to a total number of a plurality of the particles. Since the surface-coated cutting tool of the present invention has such configuration, the hard coating thereof exhibits excellent chipping resistance and adhesion resistance.

Additionally, in the cross-section of the hard coating perpendicular to the surface of the tool body, a number ratio of the particles in each of which a straight line forming the long diameter in the cross-section thereof forms an angle of 45° or less with respect to the surface of the tool body and each of which satisfies A>B where A is an area of a region surrounded by the straight line forming the long diameter and outer circumference of the particle at a surface side of the hard coating and B is an area of region surrounded by the straight line and the outer circumference of the particle at a tool body side, is 80% or more with respect to the total number of a plurality of the particles in the complex nitride layer or complex carbonitride layer of Al, Cr, and Si. Thereby, the hard coating exhibits more excellent chipping resistance and adhesion resistance. As a result, for example, in milling of alloy tool steel or the like, excellent cutting performance is exhibited in long-term usage.

DETAILED DESCRIPTION OF THE INVENTION

Figure 1A:
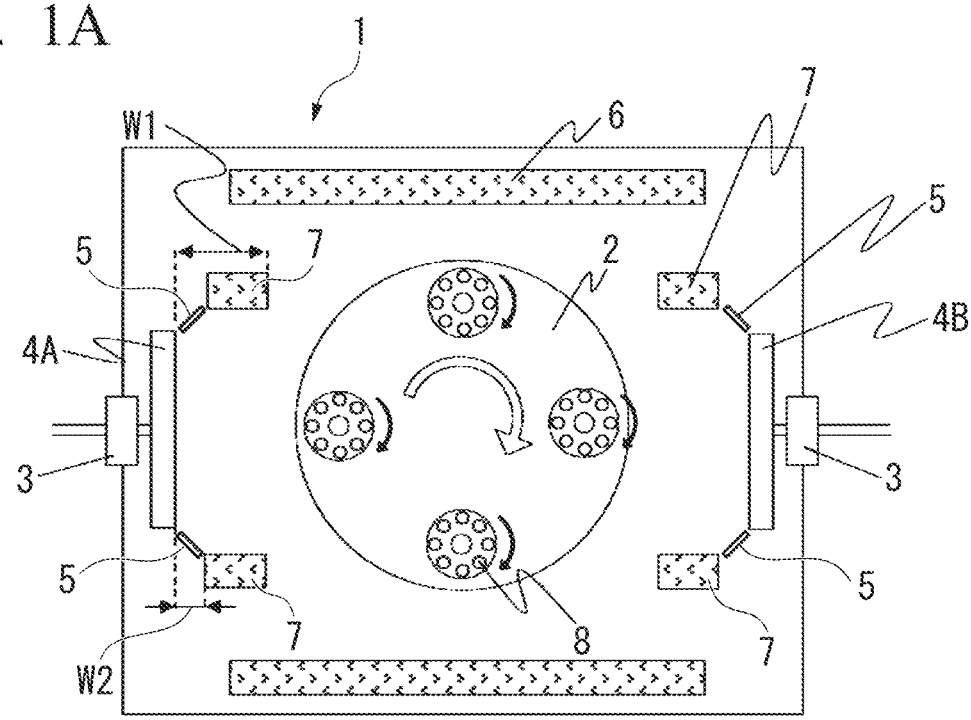
FIG. 1A is a schematic illustration of an arc ion plating furnace for forming a hard coating of a coated tool of the present invention and is a cross-sectional plane view of the arc ion plating furnace.

The present invention will be described below in detail.
Hard coating layer composed of (Al, Cr, Si)(C, N) layer or (Al, Cr, Si)N layer:

In a hard coating layer composed of (Al, Cr, Si)(C, N) layer or (Al, Cr, Si)N layer, as the constituent component thereof, Al component improves high-temperature hardness and heat resistance, Cr component improves high-temperature strength, and Si component improves oxidation resistance. In addition, coexistence of Al and Cr improves high-temperature oxidation resistance.

However, in the (Al, Cr, Si)(C, N) layer or the (Al, Cr, Si)N layer, when the Cr content x is less than 0.1 with respect to the total amount of Al, Cr, and Si, Al content is relatively high. Thus, in milling of work material with high adhesivity, the adhesion resistance to the work material and chips cannot be ensured, and high-temperature strength is deteriorated. Therefore, adhesion and chipping easily occur. On the other hand, when the Cr content x exceeds 0.4 with respect to the total amount of Al, Cr, and Si, the melting point of the target is high at the time of forming the hard coating layer using a PVD method. Therefore, Cr concentration of by-produced spherical particles is high and the melting point of the particles is high relative to particles of which the Cr content x is 0.4 or less with respect to the total amount of Al, Cr, and Si. Therefore, after particle generated from the target is attached to the film and until the particle sticks, the heat quantity removed from the particle is small, and thus the particle sticks while keeping the spherical shape thereof. By depositing a film thereon, voids are remained below the particles. Due to existence of voids, during cutting, cracks occur from voids as a start point and chipping easily occurs.

Accordingly, the Cr content x with respect to the total amount of Al, Cr, and Si is set to 0.1 to 0.4. The content x is preferably 0.15 to 0.37 and more preferably 0.2 to 0.3, but is not limited thereto.

Here, the proportion of metal component and non-metal component is not limited to 1:1 as stoichiometric proportion. As long as the same crystal structure as a case where the proportion is 1:1 is maintained, the effects of the present invention can be obtained.

When the Si content y is less than 0.01 with respect to the total amount of Al, Cr, and Si, effect of improving oxidation resistance is small. In addition to this, the Cr content is relatively high, and thus the melting point of the particles is high. Therefore, as described above, voids are formed below the particle included in the (Al, Cr, Si)(C, N) layer or the (Al, Cr, Si)N layer, resulting in small effect of improving chipping resistance. On the other hand, when the Si content y exceeds 0.2 with respect to the total amount of Al, Cr, and Si, high-temperature toughness and high-temperature strength of the (Al, Cr, Si)(C, N) layer or the (Al, Cr, Si)N layer are deteriorated. Therefore, the Si content y with respect to the total amount of Al, Cr, and Si is set to 0.01 to 0.2. The content y is preferably 0.07 to 0.2 and more preferably 0.1 to 0.15, but is not limited thereto.

When the C content z exceeds 0.3 with respect to the total amount of C and N, the hardness of the hard coating layer is excessively high and thus chipping resistance thereof is deteriorated in cutting. Therefore, the C content z with respect to the total amount of C and N is set to 0.3 or less. The content z is preferably 0 to 0.2, but is not limited thereto.

When the thickness of the hard coating layer is less than 0.5 μm, after an early stage of cutting, the hard coating layer is early lost, and wear resistance cannot be exhibit sufficiently. On the other hand, when the thickness exceeds 8.0 μm, compressive residual stress accumulated on the (Al, Cr, Si)(C, N) layer or the (Al, Cr, Si)N layer increases. Therefore, the hard coating layer on the edge-tip ridge portion is highly sensitive to external force during cutting and chipping easily occurs at an early stage of cutting. Alternatively, the film self-destructs.

Accordingly, the average thickness of the (Al, Cr, Si)(C, N) layer or the (Al, Cr, Si)N layer is set to 0.5 μm to 8.0 μm. The average thickness of the (Al, Cr, Si)(C, N) layer or the (Al, Cr, Si)N layer is preferably 0.7 μm to 7.5 μm, but is not limited thereto.

Constitution of Particles:

A plurality of particles included in the hard coating layer of the present invention means an agglomeration including: less than 10 atomic % of non-metal components (that is, one or more selected from C and N); and metal components which are other than the non-metal components (one or more selected from Cr, Al, and Si).

The amount of the non-metal components is preferable 0.5 atomic % to less than 10 atomic %. In a plurality of the particles included in the hard coating layer, a small amount of inevitable impurities may be mixed in addition to the above-mentioned non-metal components and the metal components. However, inevitable impurities may be mixed only if the mixed inevitable impurities do not significantly affect chipping resistance and/or adhesion resistance of the hard coating including the hard coating layer.

The Al content of each of the particles can be set to 50 atomic % or less, mainly by controlling the total pressure of nitrogen and methane within a range of 4 to 10 Pa at the time of forming the (Al, Cr, Si)(C, N) layer or the (Al, Cr, Si)N layer using a PVD method.

When the Al content in each particle exceeds 50 atomic %, the particles with a melting point lower than that of the (Al, Cr, Si)(C, N) layer or the (Al, Cr, Si)N layer are present in the layer, due to which high-temperature strength cannot be maintained and thus adhesion easily occurs.

Accordingly, the Al content in each of a plurality of the particles (oblate particles) is set to 50 atomic % or less. The Al content of each particle is preferably 0.5 to 50 atomic %, and more preferably 0.5 to 20 atomic %, but is not limited thereto.

For the particles in the (Al, Cr, Si)(C, N) layer or the (Al, Cr, Si)N layer as the hard coating layer included in the hard coating of the coated tool of the present invention, when a cross-sectional long diameter of each particle in a cross-section perpendicular to the surface of the tool body is 0.5 μm or more, the particles with relatively low hardness are present widely in the layer, and hardness of the (Al, Cr, Si)(C, N) layer or the (Al, Cr, Si)N layer lowers. As a result, wear resistance during cutting cannot be ensured sufficiently.

For the particles in the (Al, Cr, Si)(C, N) layer or the (Al, Cr, Si)N layer as the hard coating layer included in the hard coating of the coated tool of the present invention, when the aspect ratio of each particle is less than 2.0 μm, the shape of each particle is substantially spherical at the time of forming the hard coating layer using a PVD method and thus the voids are formed below the spherical particles. Therefore, the voids serve as a start point of generation of cracks during cutting, and thus the chipping resistance is deteriorated.

Accordingly, for the particles in the (Al, Cr, Si)(C, N) layer or the (Al, Cr, Si)N layer as the hard coating layer included in the hard coating of the coated tool of the present invention, the cross-sectional long diameter of each particle is set to less than 0.5 μm and the aspect ratio of each particle is set to 2.0 or more.

However, it is not necessary for all the particles to have the Al content of the 50 atomic % or less, the cross-sectional long diameter of less than 0.5 μm, and the aspect ratio of 2.0 or more. If the number ratio of particles (oblate particles)

having an Al content of the 50 atomic % or less, a cross-sectional long diameter of less than 0.5 µm, and an aspect ratio of 2.0 or more is 90% or more with respect to the total number of the particles, chipping resistance and adhesion resistance intended in the present invention can be obtained.

The cross-sectional long diameter of the particle included in the hard coating layer of the surface coated tool of the present invention is defined as the length of the longest one of the straight lines which can be drawn only within the particle when the cross-sectional shape of the particle in the cross-section of the film perpendicular to the surface of the tool body is observed. That is, a straight line laid passingly out of the particle is not used for deciding the cross-sectional long diameter.

Additionally, the aspect ratio of the particle included in the hard coating layer of the surface coated tool of the present invention is a value of the cross-sectional long diameter/a cross-sectional short diameter where the cross-sectional short diameter of the particle is defined as the longest value of particle widths orthogonal to the straight line forming the cross-sectional long diameter in the cross-section of the film perpendicular to the surface of the tool body.

In the present invention, in addition to the condition where each of all particles including in the hard coating layer has the Al content of 50 atomic % or less, the cross-sectional long diameter of less than 0.5 and the aspect ratio of 2.0 or more, in a case where a number ratio of particles in each of which an angle between the straight line forming the cross-sectional long diameter thereof and the surface of the tool body is 45° or less and which each satisfies A>B where A is an area of a region surrounded by the straight line forming the cross-sectional long diameter and outer circumference of the particle at a surface side of the hard coating and B is an area of region surrounded by the straight line and the outer circumference of the particle at a tool body side, is 80% or more with respect to a total number of the particles, more excellent chipping resistance is exhibited.

This is because of the following reasons.

That is, as the wear of the hard coating layer proceeds during cutting, the particles (oblate particles) are exposed on the surface of the hard coating layer. Since the hardness of the particles is small compared with the hard coating layer, wear proceeds quickly at the particle portions compared with the hard coating layer. Therefore, wear proceeds such that the particle portions are hollowed deeply compared with the hard coating layer, and concave portions are formed. At this time, if the angle between the straight line forming the cross-sectional long diameter of each particle and the surface of the tool body exceeds 45°, or if A≤B is satisfied, the formed concave portions are relatively deep. Therefore, stress in a shear direction caused by cutting concentrates at the edges of the concave portions, they serve as a start point of fracture proceeding in the hard coating, and thus chipping easily occurs. However, if the angle between the straight line forming the cross-sectional long diameter of each particle and the surface of the tool body is 45° or less and A>B is satisfied, the formed concave portions are relatively shallow. Therefore, it is difficult to concentrate shear stress during cutting, and thus occurrence of chipping can be suppressed.

Accordingly, in the present invention, it is desirable that a number ratio of particles (oblate particles) in each of which the angle between the straight line forming the cross-sectional long diameter thereof and the surface of the tool body is 45° or less and each of which satisfies A>B where A is an area of a region surrounded by the straight line forming the long diameter and outer circumference of the particle at the surface side of the hard coating and B is an area of region surrounded by the straight line and the outer circumference of the particle at the tool body side, be 80% or more with respect to a total number of the particles. Thereby, chipping resistance and adhesion resistance are further improved, and excellent cutting performance is exhibited.

The compositions of the hard coating layer and the particles included in the hard coating layer can be obtained by structure observation and composition analysis of the cross-section of the hard coating layer perpendicular to the surface of the tool body using a transmission electron microscope-energy dispersive X-ray spectrometry (TEM-EDS). An observed range in this case is within 20 µm in a direction parallel to the surface of the tool body. Further, elemental mapping is performed on the cross-section of the hard coating layer with a space resolution of 0.01 µm or less. Thereby, for example, it can be confirmed that the composition of the (Al, Cr, Si)(C, N) layer or the (Al, Cr, Si)N layer is within the prescribed range. Simultaneously, the composition of the particles can be analyzed by point analysis in the cross-section of the film.

The aspect ratio of each particle can be obtained as following. First, the longest diameter of particle in the cross-section thereof is regarded as a cross-sectional long diameter, and the longest value of the particle widths orthogonal to a straight line forming the cross-sectional long diameter is regarded as a cross-sectional short diameter of the particle. Then, the cross-sectional long diameter and the cross-sectional short diameter of each particle are obtained, from which an aspect ratio (=the cross-sectional long diameter/the cross-sectional short diameter) of each particle is obtained.

The number ratio of the particles with the Al content of 50 atomic % or less, the cross-sectional long diameter of less than 0.5 µm, and the aspect ratio of 2.0 or more, can be obtained as following. For the coated tool as a measuring object, the cross-section of the hard coating layer is analyzed similar to the above-described analysis. First, the total number of the particles present in the observed region (5 µm×5 µm) is counted in a N mapping image using TEM-EDS. Secondly, among all particles, the number of the particles is counted, each of which contains 90 atomic % or more of one or more elements selected from Cr, Al, and Si with respect to the total amount of the constituent elements constituting the particles, has the Al content of 50 atomic % or less, the cross-sectional long diameter of less than 0.5 µm, and the aspect ratio of 2.0 or more. Based on the results of counting the number of the particles, with respect to the total number of the particles, the number ratio of the particles (oblate particles) with the Al content of 50 atomic % or less, the cross-sectional long diameter of less than 0.5 µm, and the aspect ratio of 2.0 or more, is calculated. Here, the number of the particles per unit area is preferably $1/\mu m^2$ to $5/\mu m^2$.

For all particles present in the observed region, the angle between a straight line forming the cross-sectional long diameter of each metal particle and the surface of the tool body is obtained. For each of the particles in which the angle is 45° or less, an area A of a region surrounded by the straight line forming the cross-sectional long diameter and the outer circumference of the particle at the surface side of the hard coating and an area B of a region surrounded by the straight line and the outer circumference of the particle at the tool body side, are obtained. The values of A and B are compared with each other, and the number ratio of the particles satisfying A>B is calculated. The method of calculating the areas A and B is as follows. A TEM-EDS mapping image of each particle is used. By using a mapping image where an amount of N is analyzed, boundaries between the particle and the hard coating layer can be distinguished. The outer circumference of the particle is selected, and the area of region surrounded thereby can be calculated using image analysis software (for example, Adobe Photoshop or the like). The calculated area is represented as A. Further, the cross-sectional long diameter of the particle and the outer circumference of the particle at the tool body side are selected, and the area of region surrounded thereby is calculated using the image analysis software and is represented as B. This process is performed on each particle, and the number ratio of the particles satisfying A>B is calculated.

Next, Examples of the coated tool of the present embodiment will be described in detail.

EXAMPLE

As a raw material powders, a medium-coarse WC powder with an average grain size of 5.5 μm, a fine WC powder with an average grain size of 0.8 μm, a TaC powder with an average grain size of 1.3 μm, a NbC powder with an average grain size of 1.2 μm, a ZrC powder with an average grain size of 1.2 μm, a $Cr_3C_2$ powder with an average grain size of 2.3 μm, a VC powder with an average grain size of 1.5 μm, a (Ti, W)C powder [TiC/WC=50/50 in terms of mass ratio] with an average grain size of 1.0 μm, and a Co powder with an average grain size of 1.8 μm, were prepared. These raw material powders were mixed in compositions shown in Table 1. Wax was further added thereto. The mixture was blended in acetone by a ball mill for 24 hours and was dried under reduced pressure. Thereafter, the resultant was press-formed at a pressure of 100 MPa into various types of compacts having predetermined shapes. The compacts were heated to a predetermined temperature in a range of 1370 to 1470° C. in a vacuum atmosphere of 6 Pa at a heating rate of 7° C./min, and were held at this temperature for one hour. Thereafter, the compacts were sintered under furnace-cool conditions, thereby forming sintered round bar for forming tool bodies with a diameter of 8 mm. From the sintered round bar, by grinding, tool bodies (end mills) A to E made of WC-based cemented carbide having a two-edge ball shape with a helix angle of 30° in dimensions of 6 mm×13 mm as the diameter×the length of the cutting edge portion were produced.

Figure 1B:
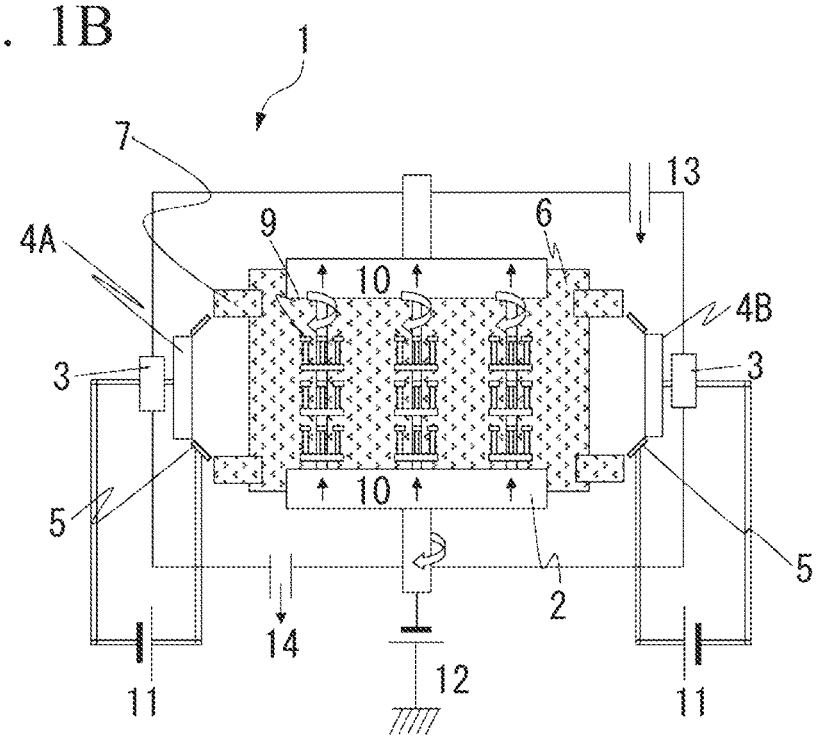
FIG. 1B is a schematic illustration of the arc ion plating furnace for forming the hard coating of the coated tool of the present invention and is a longitudinal cross-sectional view of the arc ion plating furnace.
Figure 2A:
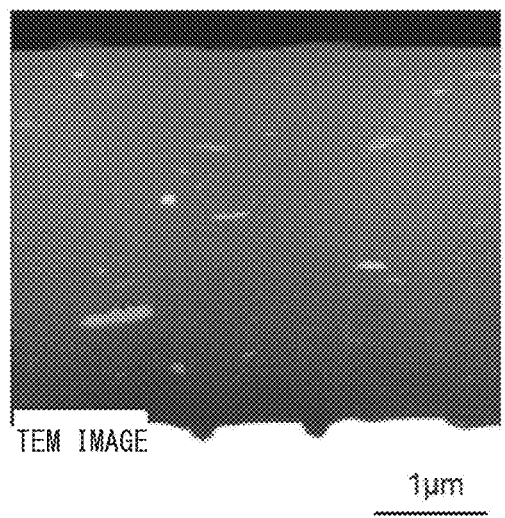
FIG. 2A is a TEM image of a cross-section of an $(Al_{0.63}Cr_{0.27}Si_{0.10})N$ layer of an invention coated tool 8 as an example of the coated tool of the present invention.
Figure 2B:
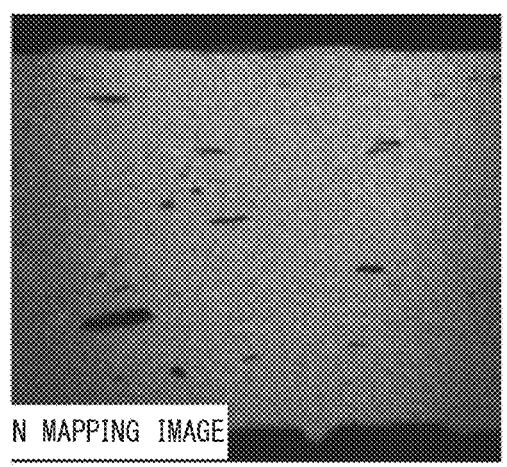
FIG. 2B is a N mapping image by EDS of the cross-section of the $(Al_{0.63}Cr_{0.27}Si_{0.10})N$ layer of the invention coated tool 8 as an example of the coated tool of the present invention.
Figure 2C:
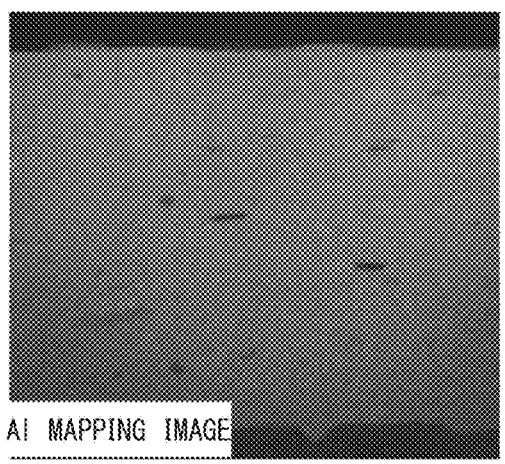
FIG. 2C is an Al mapping image by EDS of the cross-section of the $(Al_{0.63}Cr_{0.27}Si_{0.10})N$ layer of the invention coated tool 8 as an example of the coated tool of the present invention.
Figure 2D:
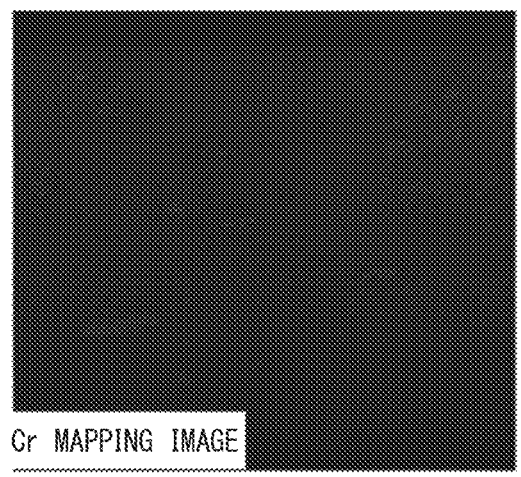
FIG. 2D is a Cr mapping image by EDS of the cross-section of the $(Al_{0.63}Cr_{0.27}Si_{0.10})N$ layer of the invention coated tool 8 as an example of the coated tool of the present invention.
Figure 2E:
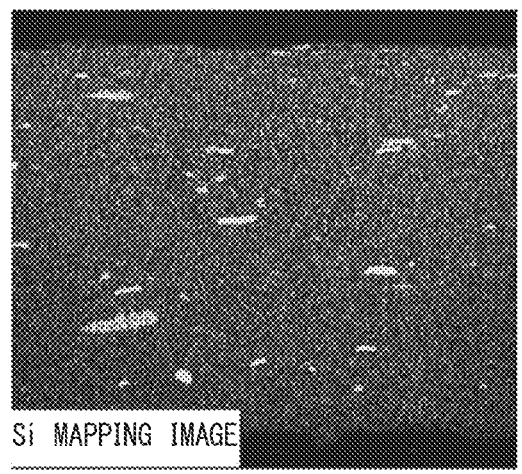
FIG. 2E is a Si mapping image by EDS of the cross-section of the $(Al_{0.63}Cr_{0.27}Si_{0.10})N$ layer of the invention coated tool 8 as an example of the coated tool of the present invention.

Next, these tool bodies A to E were loaded in the arc ion plating furnace shown in FIGS. 1A and 1B, and subjected to Ar bombardment under the following conditions.

First, while the inside of the furnace was evacuated and maintained in a vacuum at 0.1 Pa or lower, the inside of the furnace was heated to 500° C. by a heater. Thereafter, under the atmosphere with Ar gas pressure of 0.5 to 1.0 Pa, and under the condition where current flowing through a tungsten filament was 50 to 60 A, bombard treatment for one minute was repeated for three times, thereby removing contaminations such as organic substances inevitably attached to the surface of the tool body.

Secondly, using targets with compositions shown in Table 2, (Al, Cr, Si)(C, N) layer or (Al, Cr, Si)N layer with a predetermined thickness was deposited under the film formation conditions shown in Table 2. Thereby, invention coated tools 1 to 10 were produced.

In the film formation conditions of Table 2, the reasons why the temperatures of inside of the furnace were set higher than that of the conventional condition (500° C.) was aiming to elongate time after scattering particles were attached to the hard coating layer and until the temperature of the particles became lower than the melting point thereof, thereby facilitating formation of particles with an aspect ratio of 2.0 or more.

The reason for setting the total pressure of nitrogen and methane within a range of 4 to 10 Pa is as follows. When the total pressure of nitrogen and methane is less than 4 Pa, movement of an arc spot is relatively slow and particles with the cross-sectional long diameter of 0.5 μm or more generate easily. Since such particles have relatively low degree of nitriding and low hardness compared with the (Al, Cr, Si)(C, N) layer or the (Al, Cr, Si)N layer, the hardness of the entire hard coating is small and wear resistance lowers during cutting. On the other hand, when the total pressure of nitrogen and methane exceeds 10 Pa, the movement of the arc spot is unstable and film formation is difficult.

For setting the temperatures of inside of the furnace higher than that of the conventional condition (500° C.), it is effective to provide cylindrical heaters in front of the targets and heat the space in front of the targets to high temperature. Thereby, particles generated from the targets can be prevented from solidifying in the atmosphere, and deform along the shape of the tool body at the time of attaching to the tool body. Damages to the film due to radiation heat from the cylindrical heater can be prevented by providing a cooling mechanism on the jigs for tool body. The cylindrical heaters for heating the space in front of the targets extend to substrate direction as seen from the targets, and the length thereof is desirably set such that the tip end of the heater is located at the position of about ⅔ to ¾ of distance between the target and tool body. When the length is too long, the film is damaged due to the radiation heat. On the other hand, when the length is too short, the space at the high temperature in front of the target is narrow and thus the particles solidify before attaching to the tool body. In order to appropriately heat the space in front of the targets, the heaters are preferably disposed in the range of 50 mm or less from the surface of the targets, for example, may be disposed in front of an anode electrodes or the like. Examples of the cooling mechanism of the tool bodies include a method for cooling the tool bodies by flowing coolant water to the jigs for tool body.

For the (Al, Cr, Si)(C, N) layer or the (Al, Cr, Si)N layer of the invention coated tools 1 to 10, structure observation and composition analysis of the cross-section of the hard coating layer perpendicular to the surface of the tool body were performed using a transmission electron microscope-energy dispersive X-ray spectrometry (TEM-EDS). An observed range of each invention coated tool was within 20 μm in a direction parallel to the surface of the tool body. Elemental mappings were performed on the cross-section of the hard coating layer with a space resolution of 0.01 μm or less. Thereby, it was confirmed that the composition of each of the (Al, Cr, Si)(C, N) layer or the (Al, Cr, Si)N layer was within the prescribed range, and simultaneously, the composition of each particle was analyzed by point analysis in the cross-section of the film.

Next, the longest diameter of each particle in the cross-section thereof was regarded as a cross-sectional long diameter, and the longest value of the particle widths orthogonal to a straight line forming the cross-sectional long diameter was regarded as a cross-sectional short diameter of the particle. The cross-sectional long diameter and the cross-sectional short diameter of each particle were obtained, from which an aspect ratio (=the cross-sectional long diameter/the cross-sectional short diameter) of each particle was obtained.

The total number of the particles present in the observed region of each invention coated tool and the number of the particles each of which contained 90 atomic % or more of one or more elements selected from Cr, Al, and Si with respect to the total amount of the constituent elements constituting the particle, had an Al content of 50 atomic % or less, a cross-sectional long diameter of less than 0.5 μm, and an aspect ratio of 2.0 or more, was counted. Thereby, the number ratio of the particles with an Al content of 50 atomic % or less, a cross-sectional long diameter of less than 0.5 μm, and an aspect ratio of 2.0 or more, was calculated.

For all particles present in the observed region, the angle between a straight line forming the cross-sectional long diameter of each metal particle and the surface of the tool body was obtained. For each of the particles in which the angle was 45° or less, an area A of a region surrounded by the straight line forming the cross-sectional long diameter and the outer circumference of the particle at the surface side of the hard coating and an area B of a region surrounded by the straight line and the outer circumference of the particle at the tool body side, were obtained. The values of A and B were compared with each other, and the number ratio of the particles satisfying A>B was calculated. The method of calculating the areas A and B was as following. A TEM-EDS mapping image of each particle was used. By using a mapping image where an amount of N was analyzed, boundaries between the particles and the hard coating layer was able to be distinguished. The outer circumference of each particle was selected, and the area of region surrounded thereby was able to be calculated using image analysis software (for example, Adobe Photoshop or the like). The calculated area is represented as A. Further, the cross-sectional long diameter of the particle and the outer circumference of the particle at the tool body side were selected, and the area of region surrounded thereby was calculated using the image analysis software and was represented as B. This process was performed on each particle, and the number ratio of the particles satisfying A>B was calculated.

These measured values and the calculated values are shown in Table 3.

TEM-EDS mapping images obtained by measurement on the cross-section of $(Al_{0.63}Cr_{0.27}Si_{0.10})N$ layer of the invention coated tool 8 as an example are shown in FIGS. 2A to 2E.

Figures 3A, 3B:
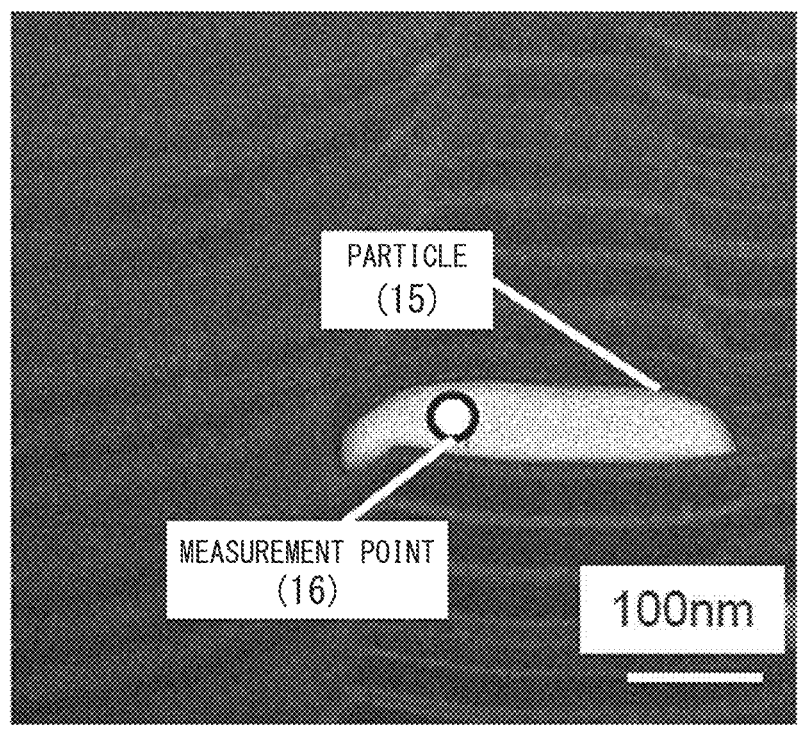
FIG. 3A is an image obtained at the time of composition analysis of particles present in the cross-section of the $(Al_{0.63}Cr_{0.27}Si_{0.10})N$ layer of the invention coated tool 8 as an example of the coated tool of the present invention and shows an analyzed particles and measurement points.
FIG. 3B shows result of EDS composition analysis at the measurement point of the particle shown in FIG. 3A.

The results of composition analysis measured for the particles present in the cross-section of the $(Al_{0.63}Cr_{0.27}Si_{0.10})N$ layer of the invention coated tool 8 are shown in FIGS. 3A and 3B.

Next, for the purpose of comparison, using the arc ion plating furnace, the surfaces of the tool bodies A to E were subjected to Ti bombardment under the same conditions as the invention examples. Then, (Al, Cr, Si)(C, N) layer or (Al, Cr, Si)N layer with a predetermined thickness in which particles were dispersed, was deposited under the conditions shown in Table 4. Thereby, comparative coated tools 1 to 10 were produced.

For the (Al, Cr, Si)(C, N) layer or the (Al, Cr, Si)N layer of each of the comparative coated tools 1 to 10, the cross-section thereof was observed using the TEM-EDS, and compositions of the particles were analyzed by point analysis in the cross-section of the film. The number ratio of the particles having an Al content of 50 atomic % or less, a cross-sectional long diameter of less than 0.5 μm, and an aspect ratio of 2.0 or more with respect to the total number of the particles, was measured. In addition, for all particles present in the measured region, the angle between a straight line forming the cross-sectional long diameter of each particle and the surface of the tool body was obtained. For each of the particles in which the angle was 45° or less, an area A of a region surrounded by the straight line forming the cross-sectional long diameter and the outer circumference of the particle at the surface side of the hard coating and an area B of a region surrounded by the straight line and the outer circumference of the particle at the tool body side, were obtained. The values of A and B were compared with each other, and the number ratio of the particles satisfying A>B was calculated with respect to the total number of all particles present in the measured region.

These values are shown in Table 5.

The thickness of each hard coating of the invention coated tools 1 to 10 and the comparative coated tools 1 to 10 was measured using a scanning electron microscope (SEM). As a result, all of them had substantially the same average thickness as the target thickness shown in Tables 3 and 5.

TABLE 1

| | | Mixing composition (mass %) | | | | | | | Diameter × length of |
|---|---|---|---|---|---|---|---|---|---|
| Type | | Co | (Ti, W)C | TaC | NbC | ZrC | $Cr_3C_2$ | VC WC | cutting edge portion (mm) |
| Tool body (End mill) | A | 5 | 5 | — | — | — | — | — Medium-coarse grain: balance | 6 × 13 |
| | B | 6 | — | 1 | 0.5 | — | — | — Fine grain: balance | 6 × 13 |
| | C | 6 | — | 1 | — | 1 | 0.5 | 0.5 Fine grain: balance | 6 × 13 |
| | D | 8 | — | — | — | — | 0.5 | 0.5 Fine grain: balance | 6 × 13 |
| | E | 9 | 25 | 10 | 1 | — | — | — Medium-coarse grain: balance | 6 × 13 |

TABLE 2

| | | | | Forming conditions of (Al, Cr, Si)(C, N) layer | | | | | |
|---|---|---|---|---|---|---|---|---|---|
| | | Tool body type | Target composition (atomic ratio) | | | Temperature in furnace (° C.) | Arc current (A) | Bias voltage (V) | Reaction gas pressure (Pa) | $N_2$:$CH_4$ gas ratio |
| Type | | | Al | Cr | Si | | | | | |
| Invention coated tool | 1 | A | 78 | 15 | 7 | 550 | 100 | −50 | 4.0 | 100:0 |
| | 2 | A | 75 | 15 | 10 | 600 | 100 | −50 | 6.0 | 90:10 |
| | 3 | B | 65 | 15 | 20 | 650 | 100 | −50 | 9.0 | 80:20 |

TABLE 2-continued

| | | | Forming conditions of (Al, Cr, Si)(C, N) layer | | | | | |
|---|---|---|---|---|---|---|---|---|
| | Tool body type | Target composition (atomic ratio) | | | Temperature in furnace (° C.) | Arc current (A) | Bias voltage (V) | Reaction gas pressure (Pa) | $N_2:CH_4$ gas ratio |
| Type | | Al | Cr | Si | | | | | |
| 4 | C | 70 | 20 | 10 | 550 | 100 | −50 | 4.0 | 100:0 |
| 5 | C | 60 | 20 | 20 | 600 | 150 | −50 | 9.0 | 90:10 |
| 6 | B | 65 | 25 | 10 | 550 | 150 | −25 | 4.0 | 100:0 |
| 7 | D | 45 | 35 | 20 | 600 | 150 | −25 | 9.0 | 90:10 |
| 8 | D | 63 | 27 | 10 | 550 | 200 | −25 | 4.0 | 100:0 |
| 9 | B | 58 | 27 | 15 | 600 | 200 | −25 | 6.0 | 100:0 |
| 10 | E | 43 | 37 | 20 | 650 | 200 | −25 | 9.0 | 90:10 |

TABLE 3

| Type | Tool body type | Composition and target thickness of (Al, Cr, Si)(C, N) layer | | | | | | Composition, shape, and present ratio of particles |
|---|---|---|---|---|---|---|---|---|
| | | Metal elements composition (atomic ratio) | | | Non-metal elements composition (atomic ratio) | | Target average thickness (μm) | Average Al content of all particles (atomic %) |
| | | Al | Cr | Si | N | C | | |
| Invention coated tool | 1 | A | 78 | 15 | 7 | 100 | 0 | 0.7 | 5 |
| | 2 | A | 75 | 15 | 10 | 90 | 10 | 4.0 | 10 |
| | 3 | B | 65 | 15 | 20 | 80 | 20 | 6.0 | 4 |
| | 4 | C | 70 | 20 | 10 | 100 | 0 | 2.0 | 6 |
| | 5 | C | 60 | 20 | 20 | 90 | 10 | 4.0 | 8 |
| | 6 | B | 65 | 25 | 10 | 100 | 0 | 4.0 | 10 |
| | 7 | D | 45 | 35 | 20 | 90 | 10 | 6.0 | 9 |
| | 8 | D | 63 | 27 | 10 | 100 | 0 | 2.0 | 10 |
| | 9 | B | 58 | 27 | 15 | 100 | 0 | 4.0 | 5 |
| | 10 | E | 43 | 37 | 20 | 90 | 10 | 7.5 | 10 |

| Type | | Number ratio of particles with Al content of 50 atomic % or less (%) | Number ratio of particles with cross-sectional long diameter of less than 0.5 μm (%) | Number ratio of particles with aspect ratio of 2.0 or more (%) | Number ratio of particles prescribed in present invention (%) | Number ratio of particles having angle of 45° or less between straight line forming cross-sectional long diameter and surface of tool body and satisfying A/B > 1 (%) |
|---|---|---|---|---|---|---|
| Invention coated tool | 1 | 97.5 | 95.0 | 97.5 | 92.5 | 95.0 |
| | 2 | 97.5 | 95.0 | 97.5 | 95.0 | 90.0 |
| | 3 | 97.5 | 100.0 | 95.0 | 95.0 | 87.5 |
| | 4 | 95.0 | 97.5 | 100.0 | 95.0 | 77.5 (*2) |
| | 5 | 95.0 | 95.0 | 97.5 | 95.0 | 92.5 |
| | 6 | 95.0 | 97.5 | 97.5 | 95.0 | 97.5 |
| | 7 | 100.0 | 95.0 | 97.5 | 95.0 | 82.5 |
| | 8 | 97.5 | 97.5 | 100.0 | 97.5 | 90.0 |
| | 9 | 92.5 | 95.0 | 97.5 | 92.5 | 87.5 |
| | 10 | 100.0 | 95.0 | 97.5 | 95.0 | 92.5 |

(*2) indicates that value is out of the range of Claim 2.

TABLE 4

| | | Tool body type | Forming conditions of (Al, Cr, Si)(C, N) layer | | | | | | | |
|---|---|---|---|---|---|---|---|---|---|---|
| | | | Target composition (atomic ratio) | | | Temperature in furnace (° C.) | Arc current (A) | Bias voltage (V) | Reaction gas pressure (Pa) | N₂:CH₄ gas ratio |
| Type | | | Al | Cr | Si | | | | | |
| Comparative coated tool | 1 | A | 80 | 15 | 5 | 500 | 100 | −50 | 4.0 | 100:0 |
| | 2 | A | 70 | 20 | 10 | 500 | 100 | −50 | 9.0 | 90:10 |
| | 3 | B | 65 | 25 | 10 | 550 | 150 | −50 | 2.0 | 80:20 |
| | 4 | C | 63 | 27 | 10 | 600 | 150 | −50 | 2.0 | 100:0 |
| | 5 | C | 78 | 15 | 7 | 550 | 100 | −50 | 4.0 | 0:100 |
| | 6 | B | 85 | 5 | 10 | 600 | 150 | −50 | 9.0 | 100:0 |
| | 7 | D | 40 | 50 | 10 | 500 | 100 | −50 | 4.0 | 90:10 |
| | 8 | D | 78 | 20 | 2 | 500 | 100 | −25 | 9.0 | 50:50 |
| | 9 | B | 50 | 20 | 30 | 550 | 100 | −25 | 4.0 | 100:0 |
| | 10 | E | 20 | 50 | 30 | 600 | 100 | −50 | 9.0 | 90:10 |

TABLE 5

| | | Tool body type | Composition and target thickness of (Al, Cr, Si)(C, N) layer | | | | | | Composition, shape, and present ratio of particles Average Al content of all particles (atomic %) |
|---|---|---|---|---|---|---|---|---|---|
| | | | Metal elements composition (atomic ratio) | | | Non-metal elements composition (atomic ratio) | | Target average thickness (μm) | |
| Type | | | Al | Cr | Si | N | C | | |
| Comparative coated tool | 1 | A | 80 | 15 | 5 | 100 | 0 | 4.0 | 8 |
| | 2 | A | 70 | 20 | 10 | 90 | 10 | 6.0 | 10 |
| | 3 | B | 65 | 25 | 10 | 80 | 20 | 0.5(*1) | 7 |
| | 4 | C | 63 | 27 | 10 | 100 | | 10(*1) | 12 |
| | 5 | C | 78 | 15 | 7 | 0(*1) | 100(*1) | 4.0 | 11 |
| | 6 | B | 85 | 5(*1) | 10 | 90 | 10 | 4.0 | 10 |
| | 7 | D | 40 | 50(*1) | 10 | 90 | 10 | 4.0 | 15 |
| | 8 | D | 78 | 20 | 2(*1) | 50(*1) | 50(*1) | 4.0 | 8 |
| | 9 | B | 50 | 20 | 30(*1) | 100 | 0 | 0.5(*1) | 4 |
| | 10 | E | 20 | 50 | 30(*1) | 90 | 10 | 10(*1) | 5 |

| | | Composition, shape, and present ratio of particles | | | | |
|---|---|---|---|---|---|---|
| Type | | Number ratio of particles with Al content of 50 atomic % or less (%) | Number ratio of particles with cross-sectional long diameter of less than 0.5 μm (%) | Number ratio of particles with aspect ratio of 2.0 or more (%) | Number ratio of particles prescribed in present invention (%) | Number ratio of particles having angle of 45° or less between straight line forming cross-sectional long diameter and surface of tool body and satisfying A/B > 1 (%) |
| Comparative coated tool | 1 | 95.0 | 97.5 | 42.5(*1) | 42.5(*1) | 55.0(*2) |
| | 2 | 97.5 | 100.0 | 65.0(*1) | 62.5(*1) | 67.5(*2) |
| | 3 | 95.0 | 72.5(*1) | 100.0 | 67.5(*1) | 85.0 |
| | 4 | 92.5 | 65.0(*1) | 100.0 | 62.5(*1) | 90.0 |
| | 5 | 70.0(*1) | 95.0 | 75.0(*1) | 72.5(*1) | 65.0(*2) |
| | 6 | 97.5 | 97.5 | 80.0(*1) | 75.0(*1) | 72.5(*2) |
| | 7 | 100.0 | 95.0 | 97.5 | 90.0 | 82.5 |
| | 8 | 92.5 | 95.0 | 82.5(*1) | 77.5(*1) | 72.5(*2) |
| | 9 | 100.0 | 95.0 | 97.5 | 92.5 | 87.5 |
| | 10 | 100.0 | 97.5 | 100.0 | 92.5 | 90.0 |

(*1) indicates that value is out of the range of Claim 1.
(*2) indicates that value is out of the range of Claim 2.

Next, using the invention coated tools 1 to 10 and the comparative coated tools 1 to 10, milling test was performed under the following conditions, and then the wear width of a flank face of each cutting edge was measured.

Work material: a JIS SKD 61 block material (HRC 52)
Rotation speed: 17000/min.
Cutting speed: 300 m/min.
Depth of cut: ap 2.0 mm, ae 0.3 mm
Feed rate: 0.06 mm/tooth
Coolant: Air blow
Cutting length: 300 m The results of the cutting test and whether or not chipping or adhesion was occur are shown in Table 6.

TABLE 6

| Type | | Wear width of flank face (mm) | Presence or absence of adhesive or chipping | Type | | Cutting test results (m) | Presence or absence of adhesive or chipping |
|---|---|---|---|---|---|---|---|
| Invention coated tool | 1 | 0.15 | Absence | Comparative coated tool | 1 | 30 | Chipping |
| | 2 | 0.17 | Absence | | 2 | 40 | Chipping |
| | 3 | 0.13 | Absence | | 3 | 100 | Absence |
| | 4 | 0.19 | Absence | | 4 | 50 | Chipping |
| | 5 | 0.15 | Absence | | 5 | 20 | Adhesion |
| | 6 | 0.17 | Absence | | 6 | 30 | Chipping |
| | 7 | 0.13 | Absence | | 7 | 200 | Chipping |
| | 8 | 0.10 | Absence | | 8 | 20 | Chipping |
| | 9 | 0.12 | Absence | | 9 | 100 | Chipping |
| | 10 | 0.15 | Absence | | 10 | 120 | Chipping |

Cutting test results in boxes of comparative coated tools indicate a cutting length (m) until the end of a tool life was reached due to chipping or adhesion, or a cutting length (m) at the time when the wear width of flank face exceeded 0.2 mm.

In the results shown in Tables 3 and 6, each of the invention coated tools 1 to 10 had the (Al, Cr, Si)(C, N) layer or the (Al, Cr, Si)N layer of the hard coating which included particles containing 90 atomic % or more of one or more elements selected from Cr, Al and Si with respect to the total amount of constituent elements and in which the number ratio of the particles having an Al content of 50 atomic % or less, a cross-sectional long diameter of less than 0.5 μm, and an aspect ratio of 2.0 or more was 90% or more with respect to the total number of the particles. Therefore, in the milling, they exhibited excellent chipping resistance, adhesion resistance, and wear resistance.

In addition, in the invention coated tools 1 to 3, and 5 to 10, the number ratio of particles (oblate particles) in each of which the angle between a straight line forming the cross-sectional long diameter of the particle and the surface of the tool body was 45° or less and each of which satisfies A>B where A was an area of a region surrounded by the straight line forming the long diameter and outer circumference of the particle at the surface side of the hard coating and B was an area of region surrounded by the straight line and the outer circumference of the particle at the tool body side, was 80% or more with respect to a total number of the particles. Therefore, in the milling, they exhibited more excellent chipping resistance and adhesion resistance and as a result, they exhibited excellent wear resistance for a long time.

On the other hand, in the comparative coated tools 1 to 6, and 8, although the particles were formed in the hard coatings, the number ratio of the particles having an Al content of 50 atomic % or less, a cross-sectional long diameter of less than 0.5 μm, and an aspect ratio of 2.0 or more was out of the range prescribed in the present invention. Therefore, it is clear that in the milling, the end of the tool life thereof was reached within a short time due to occurrence of chipping, adhesion or the like. Further, the particles in each of the comparative coated tools 1, 2, 5, 6, and 8 did not have 45° or less of the angle between a straight line forming the cross-sectional long diameter of each particle and the surface of the tool body, and did not satisfy the relation of A>B where A was an area of a region surrounded by the straight line forming the long diameter and outer circumference of the particle at the surface side of the hard coating and B was an area of region surrounded by the straight line forming the long diameter and the outer circumference of the particle at a tool body side. Therefore, it is clear that in the milling, the end of the tool life thereof was reached within a further short time due to occurrence of chipping, adhesion or the like.

In the comparative coated tools 7, 9, and 10, although the particles were formed in the hard coating layer, the composition or thickness of the hard coating layer was out of the range prescribed in the present invention. Therefore, it is clear that in the milling, the end of the tool life thereof was reached within a short time due to occurrence of chipping.

INDUSTRIAL APPLICABILITY

As described above, the coated tool of the present invention exhibits excellent chipping resistance and adhesion resistance and enables extend the tool life, for example, in high-speed cutting of work material such as a carbon steel and an alloy tool steel, while it can be used for cutting of the other work material or under the other conditions.

In addition, the above example describes the hard coatings constituted by one layer. However, even when the hard coating includes two or more layers, the same effects are exhibited as long as at least one layer is the film described in the example.

REFERENCE SIGNS LIST

1 ARC ION PLATING FURNACE
2 ROTATION TABLE
3 MAGNET COIL
4A CATHODE ELECTRODE (AlCrSi ALLOY)
4B CATHODE ELECTRODE (TARGET) (AlCrSi ALLOY OR TARGET FOR FORMING LOWER LAYER)
5 ANODE ELECTRODE
6 HEATER
7 CYLINDRICAL HEATER
8 JIG FOR TOOL BODY
9 TOOL BODY
10 COOLANT WATER
11 ARC ELECTRIC POWER SUPPLY

12 BIAS ELECTRIC POWER SUPPLY
13 REACTION GAS
14 EXHAUST GAS
15 PARTICLES
16 MEASUREMENT POINT
W1 DISTANCE FROM SURFACE OF TARGET TO TIP END SURFACE OF CYLINDRICAL HEATER (FOR EXAMPLE, LENGTH ABOUT ⅔ OF DISTANCE BETWEEN TARGET AND TOOL BODY)
W2 DISTANCE FROM SURFACE OF TARGET TO POSTERIOR END SURFACE OF CYLINDRICAL HEATER (FOR EXAMPLE, 50 mm OR LESS)

The invention claimed is:

1. A surface-coated cutting tool comprising:
a tool body made of tungsten carbide-based cemented carbide; and
a hard coating coated on a surface of the tool body, wherein
(a) the hard coating comprises one or more layers, and at least one layer thereof is a hard coating layer composed of a complex nitride layer or a complex carbonitride layer of Al, Cr, and Si, having an average thickness of 0.5 to 8.0 μm, and satisfying an average composition formula: $(Al_{1-x-y}Cr_xSi_y)(C_zN_{1-z})$ in which x, y and z are atomic ratios and satisfy $0.1 \leq x \leq 0.4$, $0.01 \leq y \leq 0.2$, and $0 \leq z \leq 0.3$, respectively;
(b) the hard coating layer includes a plurality of particles comprising: less than 10 atomic % of non-metal component which is one or more selected from the group consisting of C and N, and metal component which is one or more elements selected from the group consisting of Cr, Al and Si; and
(c) in a cross-section of the hard coating perpendicular to the surface of the tool body, the plurality of particles include oblate particles having an Al content of 50 atomic % or less, a long diameter of less than 0.5 μm in the cross-section, and an aspect ratio of 2.0 or more, a number ratio of the oblate particles is 90% or more with respect to a total number of the plurality of the particles.

2. The surface-coated cutting tool according to claim 1, wherein
in the cross-section of the hard coating perpendicular to the surface of the tool body, a number ratio of oblate particles in each of which an angle between a straight line forming the long diameter and the surface of the tool body is 45° or less and each of which satisfies A>B where A is an area of a region surrounded by the straight line and outer circumference of the oblate particle at a surface side of the hard coating and B is an area of region surrounded by the straight line and the outer circumference of the oblate particle at a tool body side, is 80% or more with respect to a total number of the oblate particles in the hard coating layer.

3. The surface-coated cutting tool according to claim 1, wherein the average thickness of the hard coating layer is 0.7 to 7.5 μm.

4. The surface-coated cutting tool according to claim 1, wherein the hard coating layer is the outermost layer of the hard coating.

5. The surface-coated cutting tool according to claim 3, wherein the hard coating layer is the outermost layer of the hard coating.

6. The surface-coated cutting tool according to claim 1, wherein the amount of the non-metal component is contain 0.5 atomic % or more and less than 10 atomic %.

7. The surface-coated cutting tool according to claim 1, wherein Al content of the metal component is 0.5 atomic % to 20 atomic %.

8. The surface-coated cutting tool according to claim 1, wherein the number of a plurality of the particles per unit area is $1/\mu m^2$ to $5/\mu m^2$ in the cross-section.

9. The surface-coated cutting tool according to claim 2, wherein the average thickness of the hard coating layer is 0.7 to 7.5 μm.

10. The surface-coated cutting tool according to claim 2, wherein the hard coating layer is the outermost layer of the hard coating.

11. The surface-coated cutting tool according to claim 1, wherein the hard coating layer is formed in a furnace at a temperature higher than 500° C.

* * * * *